(12) United States Patent
Kroon

(10) Patent No.: US 6,424,160 B1
(45) Date of Patent: Jul. 23, 2002

(54) TESTING INSULATION BETWEEN CONDUCTORS

(75) Inventor: Adriaan Kroon, Loen aan der Vecht (NL)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/437,930

(22) Filed: Nov. 10, 1999

(30) Foreign Application Priority Data

Nov. 10, 1998 (EP) .............................. 98309207

(51) Int. Cl.⁷ .............................................. H01H 31/02
(52) U.S. Cl. ......................................... 324/540; 324/541
(58) Field of Search .................................. 324/500–600

(56) References Cited

U.S. PATENT DOCUMENTS 5,414,363 A * 5/1995 Charmoille et al. ......... 324/537

FOREIGN PATENT DOCUMENTS

DE           3900040 A1    1/1989   ........... G01R/31/02
GB           1 486 752     4/1976   ........... G01R/31/02

OTHER PUBLICATIONS

T.M. Hendricks "Testing For Short–Circuit Failures" Hewlett–Packard Journal vol. 35, No. 10 Oct. 1984, pp. 28–30.

European Search Report, Dated Apr. 23, 1999.

* cited by examiner

*Primary Examiner*—Michael J. Sherry
*Assistant Examiner*—Paresh Patel

(57) ABSTRACT

A method of testing the insulation between N electrical conductors, where $2^{n-1} < N \leq 2^n$ where n is an integer greater than 1 is disclosed which consists of carrying out n tests, each test consisting of connecting together a first set of said conductors, connecting together a second set of said conductors and testing for current leakage between the two sets, said sets being such that members of every pair of conductors are in different sets for at least one test. Apparatus for carrying out the tests consists of a set of connectors, one for each test, with terminals (a–p) for connecting to the conductors, each set of terminals being connected to a respective test point (A, B).

10 Claims, 3 Drawing Sheets

TESTING INSULATION BETWEEN CONDUCTORS

CROSS-REFERENCE TO RELATED APPLICATION

This application claims priority of European Patent Application No. 98309207.3, which was filed on Nov. 10, 1998.

TECHNICAL FIELD

This invention relates to methods of and apparatus for testing the mutual insulation between a plurality of conductors.

BACKGROUND OF THE INVENTION

It is frequently necessary to test whether all of the conductors in a cable, or, more generally, in a plurality of conductors, are properly insulated from each other. It is a simple matter, when there are only a few conductors, to do this by carrying out current leakage tests on every pair of conductors, but, since the number of pairs of conductors rises as $N(N-1)/2$, where N is the number of conductors, the number of current leakage tests rises rapidly with the number of conductors.

It is the object of the present invention to provide a faster way of testing mutual insulation in such circumstances, and apparatus for carrying out such a method.

SUMMARY OF THE INVENTION

The invention is as set out in the independent claims. Particular forms of the invention are set out in the dependent claims.

I have found that if the number of conductors N lies in the range $2^{n-1} < N <= 2^n$ only n current leakage tests are necessary. In each of the n tests the conductors are connected in two sets and the test is for current leakage between the sets. Thus, for each pair of conductors, if the conductors forming the pair are so arranged that they are in different sets of tests for at least one test, then the insulation (or current leakage) characteristics between the pair of conductors can be tested. This is true for any given pair of conductors. If, for example, there are 16 conductors and 4 tests, each pair of conductors, for example the first and third, must be in different sets in at least one of the four tests, so that at least one test will detect current leakage between that pair of conductors.

The advantage given by the invention becomes greater as n increases. Thus, some advantage is obtained with n=2, but more for n=3, more still for n=4 and increasingly more for n equal to 5, 6, 7 and 8 etc. Also, the maximum advantage for a given n is obtained when $N=2^n$.

DETAILED DESCRIPTION

Figure 1:
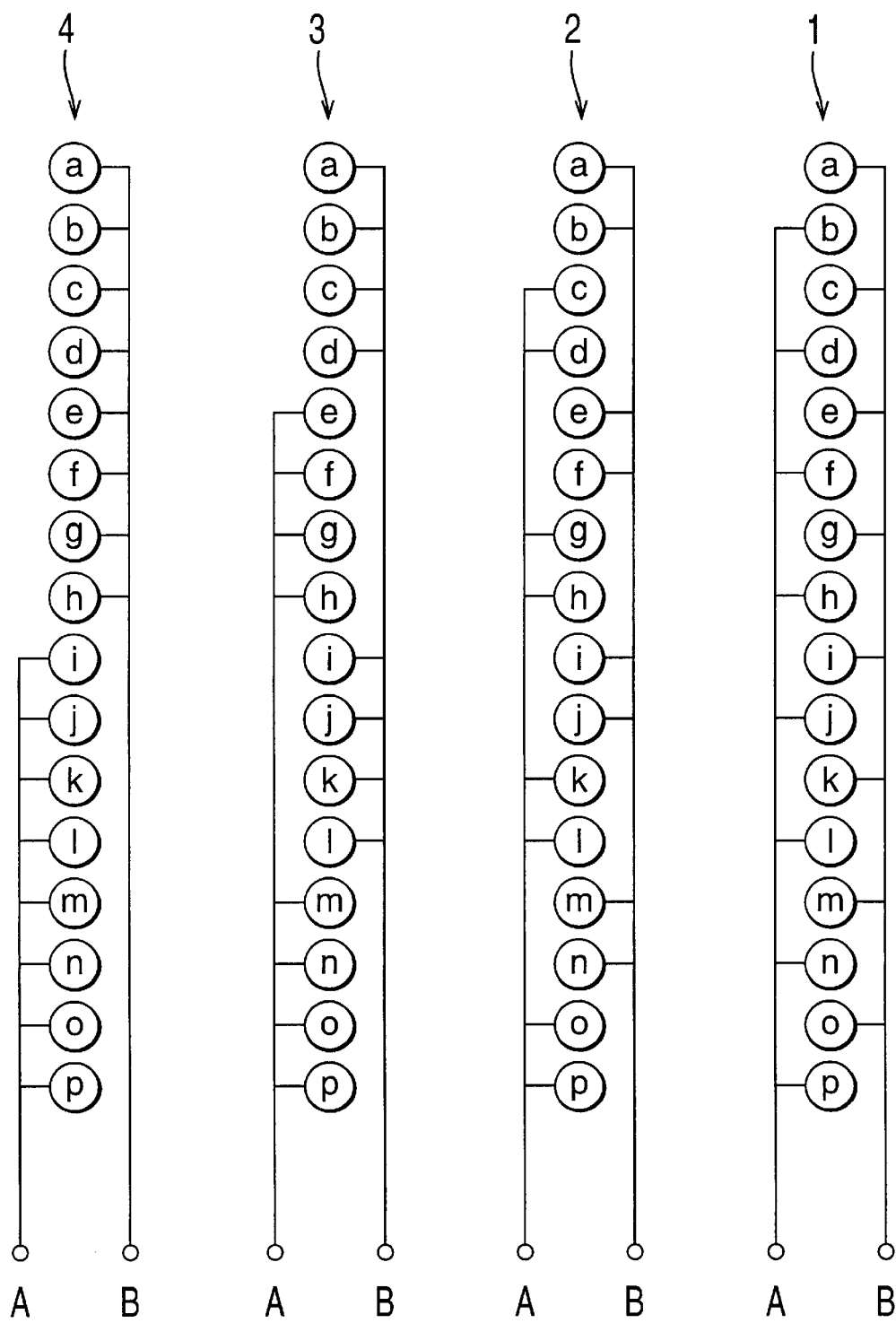
FIG. 1 shows the connections within a set of connectors for use in a method according to the invention with sixteen conductors.

If there are $2^n$ conductors it is possible to test for insulation between them by carrying out only n current leakage tests. To fix ideas, suppose that there are sixteen conductors, so that n=4, and we imagine them to be numbered from 0 to 15. In the first test, we connect together all of the even numbered conductors in a first set, and all of the odd numbered conductors in a second set and test for current leakage between the two sets. In the second test, we connect together conductors numbered 0 and 1, 4 and 5, 8 and 9 and 12 and 13 in one set and the others in a second set and test for current leakage between the two sets. In other words, we connect the first two in the first set, the next two in the second set, the next two in the first set, the next two in the second set and so on. In the third test we connect together numbers 0 to 3 and 8 to 11 in one set and the others in the second set, or, in other words, the first four in one set, the second four in the second set and so on. In the final test we connect together the first eight, numbered 0 to 7, in one set and the remainder, numbered 8 to 15, in the second.

This can be thought of another way. We express the number in the range 0 to 15 associated with each conductor as a four-digit binary number. Each test corresponds to one of the four digits, i.e., as described, the first test corresponds with the least-significant digit, the second test with the next-to-least significant digit and so on. In each test, each of the conductors that has a "0" in the corresponding digit position is in the first set and each one having a "1" is in the second set. For example, the conductor numbered 5 has the four-digit binary number 0101, so it is in the second set for the first test (least significant digit is "1"), the first set in the second test (second least significant digit is "0"), the second set in the third test (third least significant digit is "1") and the first set in the fourth test (most significant digit is "0").

We can now see that this is essentially the only way of carrying out the tests. Consider any set of four tests that will test for isolation between every pair of conductors, each test consisting of connecting some of the conductors together in a first set and the others in a second set and testing for current leakage between the two sets. We can associate a four-digit binary number with each conductor on the basis of which set it belongs to in the four tests. If the series of tests is to test effectively for isolation between the conductors, each of these four-digit binary numbers must be different, since if any pair of conductors were associated with the same number, that would mean that they belonged to the same set as each other for each of the tests, and in that case, none of the tests would detect a short circuit between them. However, there are only sixteen distinct four-digit binary numbers, namely the numbers from 0 to 15, so the four-digit binary numbers must consist precisely of the numbers from 0 to 15. Therefore, the series of tests outlined above is essentially the only one that satisfies the criteria that there are four tests and that any two conductors are in different sets for at least one of the tests. By "essentially the only one" is meant that the only difference between one series and another is the order in which the four-digit numbers are assigned to the conductors or, to put it another way, the only difference consists of a permutation of the conductors.

To carry out the method on a regular basis it is convenient to prepare a set of n connectors with interconnections corresponding to the sets of conductors already made, and provision made to carry out the required current leakage tests.

FIG. 1 shows, in diagrammatic form, a set of four sixteen-terminal connectors (1, 2, 3, 4), each with terminals (a–p) for connection to a connector (not shown) of opposite gender attached to the conductors to be tested and a pair of externally accessible terminals (A and B) as test points to facilitate the current leakage tests. The terminals in each connector are connected together in two sets as used in the method described above. Thus, in connector 1, terminals a, c, e, g, i, k, m and o are connected together and to test point B, and terminals b, d, f, h, j, l, n and p are connected together and to test point A. Plugging connector 4 in to the opposite-gender connector and testing for current leakage between test points A and B carries out the first of the tests as described above.

Similarly, in connector 2, terminals a, b, e, f, i, j, m and n are connected to test point B and terminals c, d, g, h, k, l, o and p are connected to test point A, corresponding to the second test. In connector 3, terminals a, b, c, d, i, j, k and l are connected to test point B and terminals e, f, g, h, m, n, o and p to test point A, corresponding to the third test. In connector 4, terminals a, b, c, d, e, f, g and h are connected to test point B and terminals i, j, k, l, m, n, o and p are connected to test point A, corresponding to the fourth test.

In terms of the four-digit binary numbers, terminals a–p are associated with the numbers 0–15 respectively.

Figure 2:
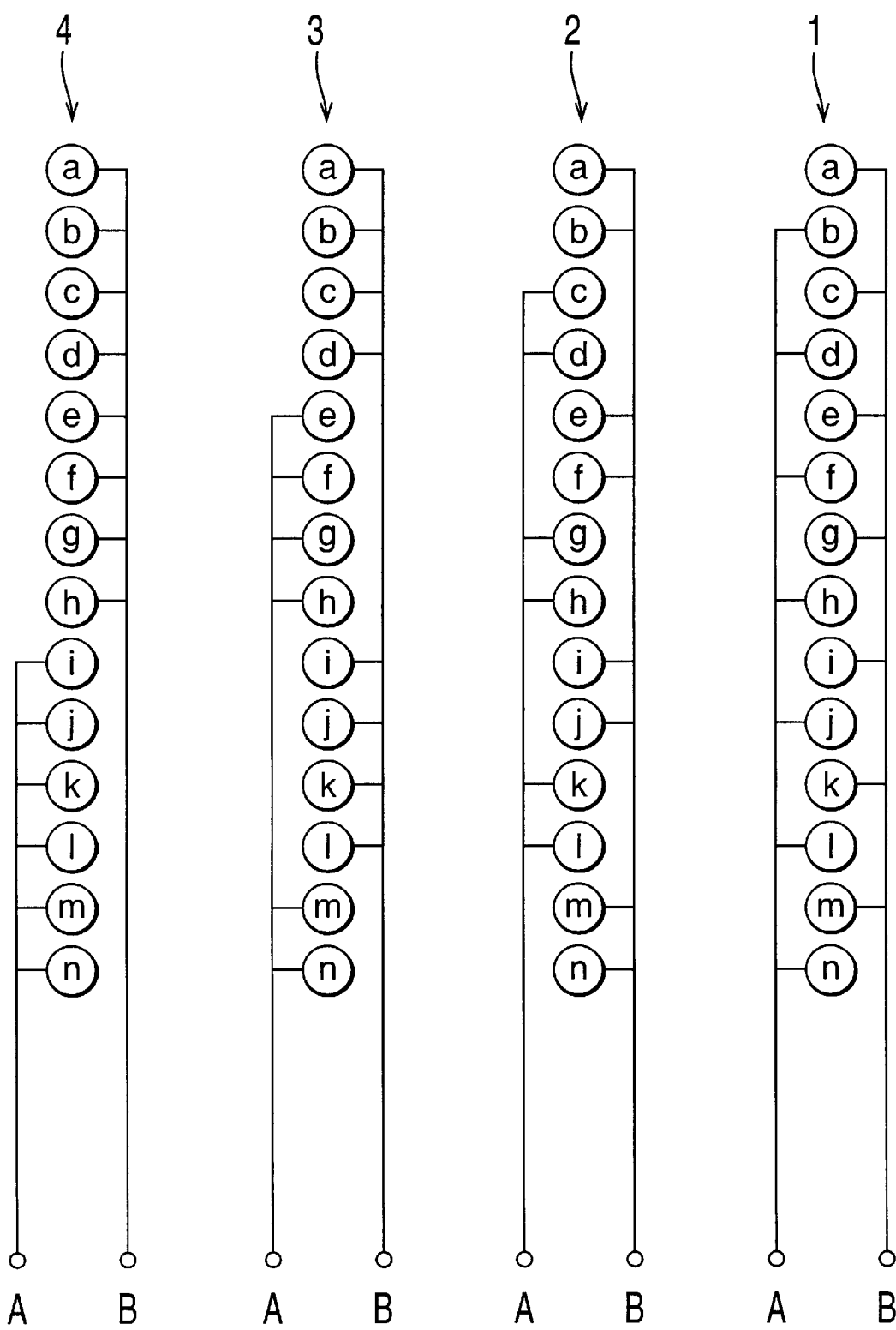
FIG. 2 shows the connections within a set of connectors for use in a method according to the invention with fourteen conductors and FIG. 3 shows the connections within an alternative set of connectors for use in a method according to the invention with fourteen conductors.

If there are fewer than sixteen conductors, but more than eight, a subset of the numbers 0 to 15 can be used, so the connections within the connectors would be as in FIG. 1, but with some of the terminals missing. FIG. 2 shows the connections within a set of connectors as shown in FIG. 1, but with terminals o and p missing, for use with fourteen conductors. the numbers previously associated with terminals o and p, namely 1110 (14) and 1111 (15) are omitted.

Of course, it could have been any two numbers that were omitted. For example, instead of 1111, it would have been possible to omit 1011, previously associated with terminal 1, and to associate 1111 with terminal 1 instead. This would mean that terminal 1 would be connected to test point A in connector 3 instead of test point B as in FIG. 2. Thus, the tests would be equally effective whether terminal 1 were connected to test point A or to test point B in connector 3. Therefore, the connection to terminal 1 in connector 3 is irrelevant to the effectiveness of the tests, and can be omitted altogether. Similarly, terminal m could have been associated with either of the numbers 1100, as in FIGS. 1 and 2, or 1110, so its connection in connector 2 is irrelevant and can be omitted. We can think of this as associating both numbers 1011 and 1111, written collectively as 1x11, with terminal 1 and both numbers 1100 and 1110, written as 11x0, with terminal m. A "1" digit then corresponds with connection to test point A (membership of the second set), a "0" digit corresponds with connection to test point B (membership of the first set) and an "x" corresponds to no connection (membership of neither set).

Figure 3:
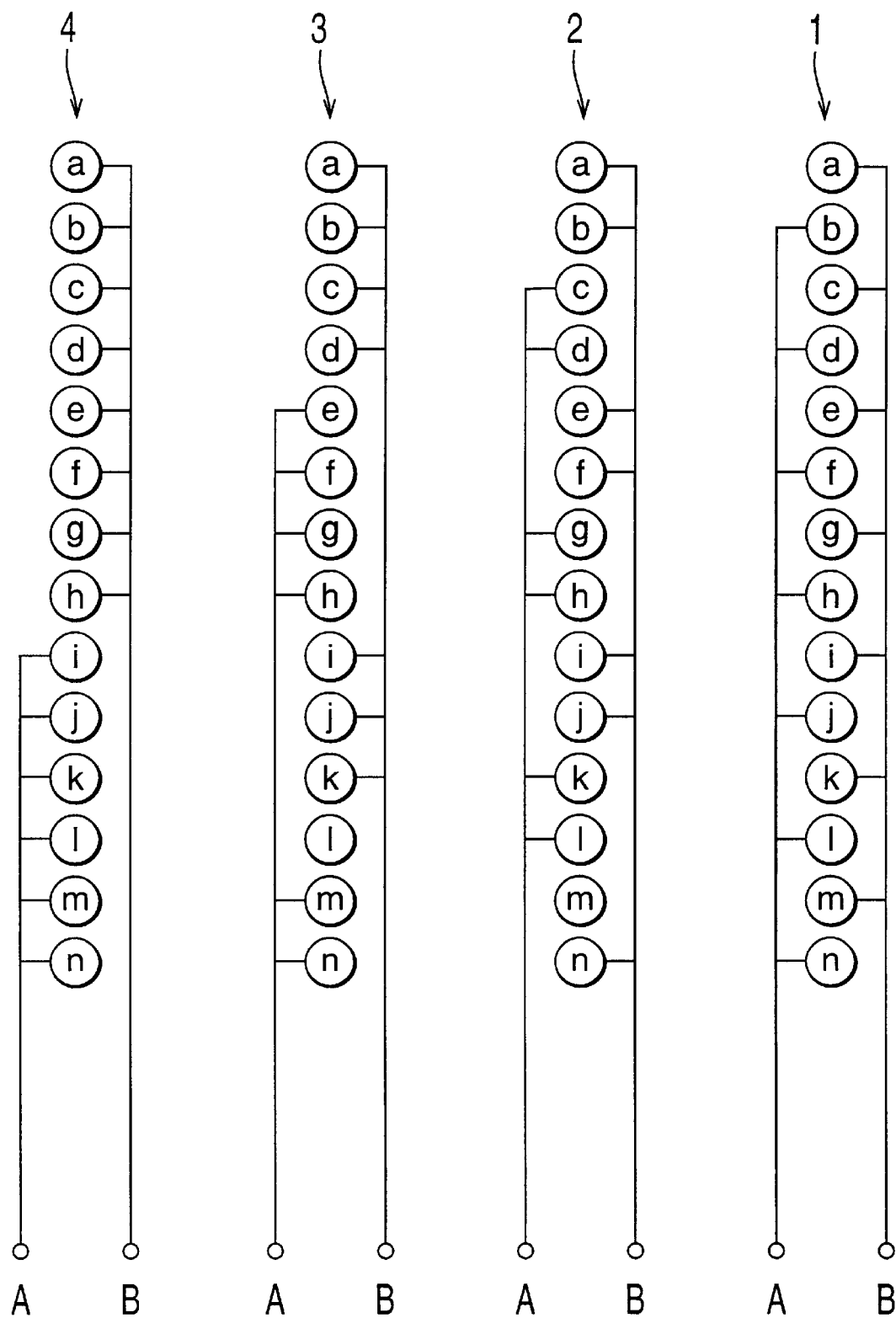

FIG. 3 shows the connections within a set of connectors as shown in FIG. 2, but with the connections to terminal 1 in connector 3 and to terminal m in connector 2 omitted. Tests carried out on fourteen conductors using the connectors of FIG. 3 will still be effective. In terms of the method, this means that in the second test, the conductor corresponding to terminal m will not be in either the first or the second set and in the third test, the conductor corresponding to terminal 1 will not be in either the first or the second set. Thus, for $N \neq 2^n$ the sets do not have to be exhaustive.

The description given above can readily be extended to values of n other than four.

The test points A and B do not have to be in the form of externally accessible terminals. For example, means for carrying out the current leakage tests may be incorporated in the connectors, in which case there is no need for external accessibility.

What is claimed is:

1. A method of testing current leakage between N electrical conductors, the method comprising the steps of:

connecting together a first set of said conductors, connecting together a second set of said conductors and testing for current leakage between the first set and the second set, said sets being such that members of every pair of conductors are in different sets for at least one test, where n is an integer greater than 1, and where $2^{n-1} < N <= 2^n$, whereby by carrying out n tests, current leakage between any pair of the N electrical conductors is determined.

2. A method as claimed in claim 1 wherein $N=2^n$.

3. A method as claimed in claim 2 wherein in each of the n tests every one of the N conductors is in one or other of the first set and the second set.

4. A method as claimed in claim 1 wherein in each of the n tests every one of the N conductors is in one or other of the first set and the second set.

5. A method as claimed in claim 1 wherein $N<2^n$ and in at least one of the tests at least one of the conductors is not in either the first set or the second set.

6. An apparatus for testing current leakage between N electrical conductors, the apparatus comprising:

means for connecting together a first set of said conductors;

means for connecting together a second set of said conductors; and means for testing for current leakage between the first set and the second set, said sets being such that members of every pair of conductors are in different sets for at least one test, where n is an integer greater than 1 and where $2^{n-1}<N<=2^n$, whereby by carrying out n tests, current leakage between any pair of the N electrical conductors is determined.

7. The apparatus as claimed in claim 6 wherein $N=2^n$.

8. The apparatus as claimed in claim 7 wherein in each of the n tests every one of the N conductors is in one or other of the first set and the second set.

9. The apparatus as claimed in claim 6 wherein in each of the n tests every one of the N conductors is in one or other of the first set and the second set.

10. The apparatus as claimed in claim 6 wherein $N<2^n$ and in at least one of the tests at least one of the conductors is not either the first set or the second set.

* * * * *